(12) United States Patent
Cleary et al.

(10) Patent No.: US 12,293,504 B2
(45) Date of Patent: May 6, 2025

(54) SEMICONDUCTOR PACKAGE INSPECTION WITH PREDICTIVE MODEL FOR WIREBOND RADIO FREQUENCY PERFORMANCE

(71) Applicant: VIASAT, INC., Carlsbad, CA (US)

(72) Inventors: Ian A. Cleary, Phoenix, AZ (US); Timothy M. Beck, San Marcos, CA (US)

(73) Assignee: VIASAT, INC., Carlsbad, CA (US)

( * ) Notice: Subject to any disclaimer, the term of this patent is extended or adjusted under 35 U.S.C. 154(b) by 350 days.

(21) Appl. No.: 17/662,281

(22) Filed: May 6, 2022

(65) Prior Publication Data

US 2023/0360188 A1 Nov. 9, 2023

(51) Int. Cl.
*G06T 7/60* (2017.01)
*G06T 7/00* (2017.01)
(Continued)

(52) U.S. Cl.
CPC ............. *G06T 7/0004* (2013.01); *G06T 7/60* (2013.01); *H01L 22/12* (2013.01); *H01L 24/48* (2013.01);
(Continued)

(58) Field of Classification Search
CPC ................. G06T 7/0004; G06T 7/60; G06T 2207/20081; G06T 2207/20084;
(Continued)

(56) References Cited

U.S. PATENT DOCUMENTS 7,831,528 B2 11/2010 Doddi et al.
10,303,823 B2 5/2019 Huang et al.
(Continued)

FOREIGN PATENT DOCUMENTS

CN 114239389 A * 3/2022
WO 2021/202163 A1 10/2021

OTHER PUBLICATIONS

Jin et al. "EMI radiation prediction and structure optimization of packages by deep learning." IEEE Access 7 (2019): 93772-93780 (Year: 2019).*

(Continued)

*Primary Examiner* — Gandhi Thirugnanam
*Assistant Examiner* — Michael Adam Shariff
(74) *Attorney, Agent, or Firm* — Vorys, Sater, Seymour and Pease LLP

(57) ABSTRACT

Methods, systems and devices for use in semiconductor package manufacture of a package having a die and die substrate are provided. A method for use in semiconductor package manufacture includes steps of forming one or more wirebond interconnections between the die and the die substrate, capturing input data representative of wirebond interconnection features during inspection of the formed wirebond interconnections, and passing the captured input data to a machine learning (ML) engine. The method further includes processing the captured input data with the machine learning engine using a trained model to obtain an output array of data, evaluating the output array of data to determine a predicted radio-frequency (RF) performance rating, and outputting the predicted RF performance rating. Training data set processing may include applying image data and parameters to a multi-layer neural network to obtain a set of candidate ML models, and selecting an optimal ML model.

34 Claims, 12 Drawing Sheets

(51) Int. Cl.
*H01L 21/66* (2006.01)
*H01L 23/00* (2006.01)

(52) U.S. Cl.
CPC ............... *G06T 2207/10048* (2013.01); *G06T 2207/20081* (2013.01); *G06T 2207/20084* (2013.01); *G06T 2207/30148* (2013.01); *H01L 2224/48227* (2013.01)

(58) Field of Classification Search
CPC ........... G06T 2207/30148; H01L 22/12; H01L 24/47; H01L 24/48; H01L 2224/48227
See application file for complete search history.

(56) References Cited

U.S. PATENT DOCUMENTS

| | | | |
|---|---|---|---|
| 10,854,486 | B2 | 12/2020 | Kirkwood et al. |
| 10,955,464 | B2 | 3/2021 | Fiore et al. |
| 11,501,116 | B1 * | 11/2022 | Kakde ..................... H01L 22/20 |
| 2009/0198635 | A1 | 8/2009 | Doddi et al. |
| 2018/0285493 | A1 | 10/2018 | Huang et al. |
| 2018/0313893 | A1 | 11/2018 | Fiore et al. |
| 2020/0090969 | A1 | 3/2020 | Kirkwood et al. |
| 2020/0242747 | A1 | 7/2020 | Watanabe |
| 2021/0010954 | A1 | 1/2021 | Adler et al. |
| 2021/0173007 | A1 | 6/2021 | Landman et al. |
| 2021/0232745 | A1 | 7/2021 | Chou et al. |
| 2021/0240906 | A1 | 8/2021 | Salik et al. |
| 2021/0287354 | A1 | 9/2021 | Kumar et al. |
| 2023/0009419 | A1 * | 1/2023 | Shinagawa ....... H01J 37/32935 |

OTHER PUBLICATIONS

Chan et al. "Ball bonding inspections using a conjoint framework with machine learning and human judgement." Applied Soft Computing 102 (2021): 107115. (Year: 2021).*

A High-Accuracy Model Average Ensemble of Convolutional Neural Networks for Classification of Cloud Image Patches on Small Datasets, Van Hiep Phung, et al., applied sciences, pp. 1-16, 2019, www.mdpi.com/journal/applsci.

Review of deep learning: concepts, CNN architectures, challenges, applications, future directions, Laith Alzubaidi, et al., Journal of Big Data, pp. 1-74, 2021, https://doi.org/10.1186/s40537-021-00444-8.

Chan et al. "Ball Bonding Inspections using a conjoint framework with machine learning and human judgement." Applied Soft Computing, vol. 102, pp. 1-13, 2021.

Jin et al. "EMI Radiation Prediction and Structure Optimization of Packages by Deep Learning." IEEE Access, vol. 7, pp. 93772-93780, 2019.

Ou et al. "Machine Learning base prediction of wire Bonding Profile in 3D stacked integrated microelectronic packaging." 2021 22nd International Conference on Electronic Packaging Technology (INCEPT), IEEE, pp. 1-4, 2021.

Sep. 5, 2023 International Search Report and Written Opinion issued in international Application No. PCT/US2023021003.

* cited by examiner

SEMICONDUCTOR PACKAGE INSPECTION WITH PREDICTIVE MODEL FOR WIREBOND RADIO FREQUENCY PERFORMANCE

TECHNICAL FIELD

The field relates to semiconductor package inspection for use in manufacture and wirebond assembly.

RELATED ART

Wirebonding is a semiconductor package manufacturing process that uses wirebonds to connect integrated circuits (ICs) or other semiconductor devices to a substrate. In one application, wirebonding is used to connect monolithic microwave integrated circuits (MMICs) on a die to a substrate. Wirebonds inherently act as antennas or lumped elements and effect the radio-frequency (RF) response of a circuit in the MMIC. The resulting performance impact may result in a manufactured package being unusable.

To detect negative performance impacts, manufacturers test packages with wirebond interconnections. Testing occurs after wirebond assembly. This testing can involve time consuming and expensive testing and probing of a package. Testing at this late stage often requires rework to reform wirebond interconnections. Additional testing of the reworked package is also required. This rework and retesting can add significant cost or delay to a semiconductor package manufacturing process.

BRIEF SUMMARY

In embodiments, methods, systems and devices for semiconductor package inspection with RF performance prediction are provided. RF performance prediction based on machine learning is used to evaluate a package having wirebond interconnections.

In an embodiment, a method of inspection for use in semiconductor package manufacture includes steps of forming one or more wirebond interconnections between the die and the die substrate, capturing input data representative of wirebond interconnection features during inspection of the formed wirebond interconnections, and passing the captured input data to a machine learning engine. The method further includes processing the captured input data with the machine learning engine using a trained model to obtain an output array of data, evaluating the output array of data to determine a predicted RF performance rating, and outputting the predicted RF performance rating.

In another embodiment, the method of inspection also includes a step of rejecting or passing the manufacture of the package according to the output predicted RF performance rating. In one aspect, the rejecting or passing of the manufacture of the package occurs during wirebonding assembly of the semiconductor package manufacture.

In a further embodiment, the method includes a step of generating an alert based on the predicted RF performance rating.

In a still further embodiment, the method includes storing a training dataset in computer-readable memory, and processing the training dataset with the machine learning engine to obtain the trained model. In one aspect, the training data set processing includes applying image data and parameters to a multi-layer neural network having feature extraction and classification to obtain a set of candidate ML models, and selecting an optimal ML model from the set of candidate ML models for use as the trained model.

In another embodiment, the trained model is a trained neural network model and the ML engine has an inference stage, and the processing the captured input data includes classifying the input data in the inference stage with the trained neural network model to obtain an output array of data having a predicted value for an RF performance rating corresponding to the package with the formed wirebond interconnections. In another aspect, the RF performance rating identifies a RF performance level from among multiple performance levels.

In a further embodiment, an inspection system includes monitoring equipment and a RF performance predictor tool. The monitoring equipment is configured to capture input data representative of wirebond interconnection features during inspection of the formed wirebond interconnections. The RF performance predictor tool is configured to: process the captured input data with a machine learning engine having a trained model to obtain an output array of data, evaluate the output array of data to determine a predicted radio-frequency (RF) performance rating, and output the predicted RF performance rating.

In another embodiment, the RF performance predictor tool is further configured to reject or pass the manufacture of the package according to the output predicted RF performance rating. An alert generator is configured to generate an alert based on the predicted RF performance rating.

In a further embodiment, an inspection system for a semiconductor package having a die, die substrate, and one or more wirebond interconnections formed between the die and the die substrate includes monitoring equipment and a wirebond assembly supervisor system and RF performance predictor tool.

In a still further embodiment, a system for predicting RF performance of wirebond interconnections formed between a die and die substrate in a package during wirebond assembly includes computer-readable memory configured to store a trained model and at least one processor configured to: process captured input data with a machine learning engine using the trained model to obtain an output array of data, evaluate the output array of data to determine a predicted RF performance rating of the formed wirebond interconnections, and output the predicted RF performance rating.

Another embodiment is drawn to a device having a computer-readable storage medium with instructions stored thereon which are configured to cause at least one processor perform operations for predicting RF performance of wirebond interconnections formed between a die and die substrate in a package.

Further embodiments, features, and advantages of the invention, as well as the structure and operation of the various embodiments of the invention are described in detail below with reference to accompanying drawings.

BRIEF DESCRIPTION OF THE FIGURES

Embodiments are described with reference to the accompanying drawings. In the drawings, like reference numbers may indicate identical or functionally similar elements. The drawing in which an element first appears is generally indicated by the left-most digit in the corresponding reference number.

DETAILED DESCRIPTION

The present disclosure describes predictive RF performance for semiconductor package manufacture. Methods, systems and devices of inspection with RF performance prediction are described. In embodiments, RF performance prediction based on machine learning is used to inspect a package having wirebond interconnections and generate a RF performance rating.

Embodiments refer to illustrations described herein with reference to particular applications. It should be understood that the invention is not limited to the embodiments. Those skilled in the art with access to the teachings provided herein will recognize additional modifications, applications, and embodiments within the scope thereof and additional fields in which the embodiments would be of significant utility.

In the detailed description of embodiments herein, references to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

The terms "wirebond" and "wirebond interconnections" are used interchangeably herein.

System with Predictive RF Performance

Figure 1:
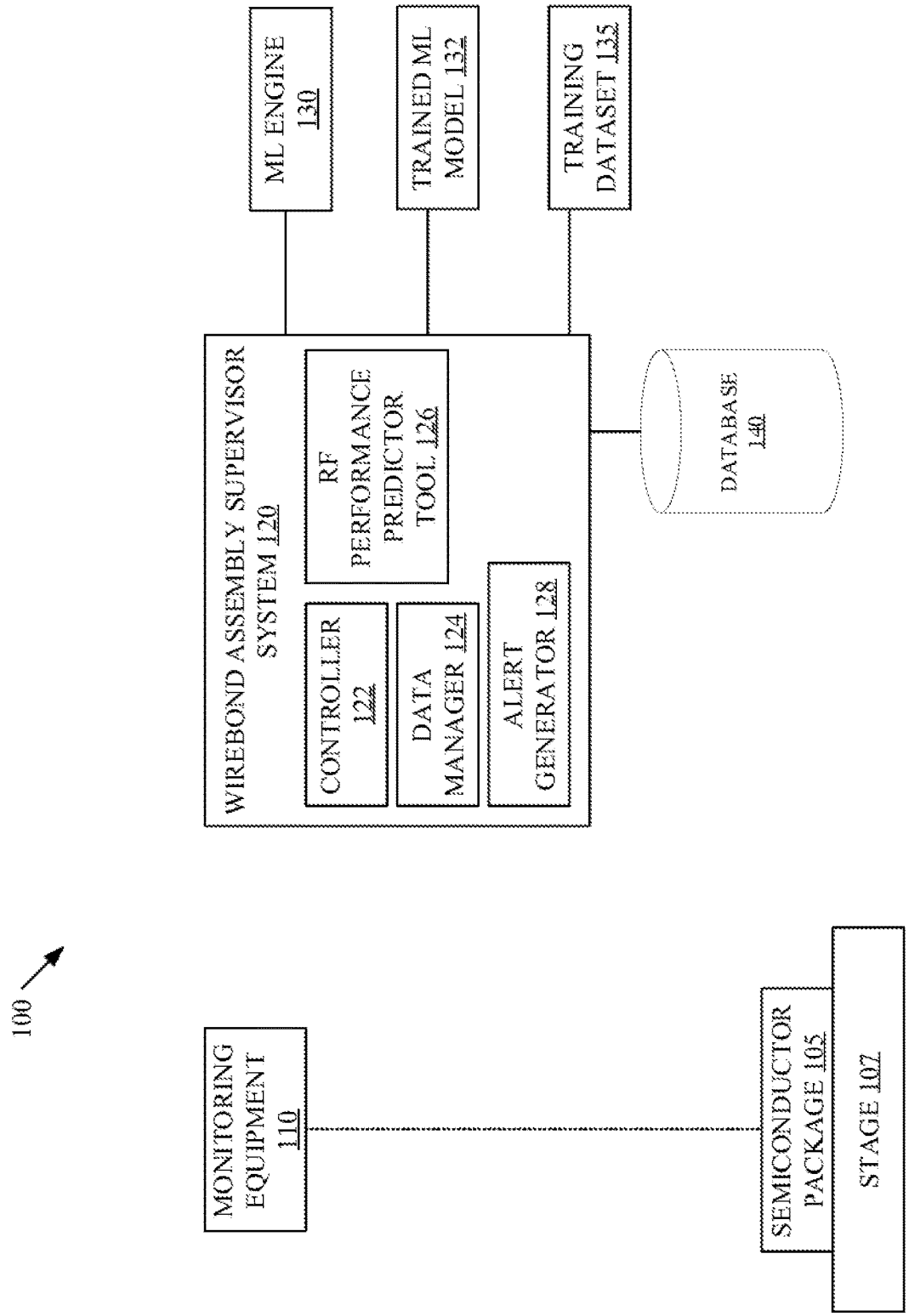
FIG. 1 is a diagram of an inspection system for use in semiconductor package manufacturing with predictive RF performance for wirebond interconnections formed in wirebond assembly according to an embodiment.

FIG. 1 is a diagram of a semiconductor package inspection system 100 with predictive RF performance for wirebond interconnections formed in wirebond assembly according to an embodiment. System 100 includes monitoring equipment 110 and wirebond assembly supervisor system (WASS) 120. A semiconductor package 105 is supported by a stage 107. In examples, semiconductor package 105 may have a die, die substrate, and one or more wirebond interconnections formed between the die and the die substrate.

WASS 120 is also coupled to a machine learning (ML) engine 130, trained ML model 132, training dataset 135 and a database 140. ML engine 130 and its operation with respect to trained ML model 132 and training dataset 135 are described in further detail below with respect to FIGS. 8 and 9. Database 140 may be one or more databases, such as, a relational database used with a database management system.

Monitoring equipment 110 is positioned relative to the package 105 to capture input data during an inspection of wirebond interconnections. Inspection can be carried out during wirebond assembly or after wirebond assembly as part of a quality control or other manufacturing or assembly process. The input data may be image data representative of wirebond interconnection features or other sensor data. In one embodiment, monitoring equipment 110 includes one or more optical or infrared camera devices and a sensor system. The camera devices capture digital images and are positioned relative to package 105 such that package regions having formed wirebond connections are within fields of view of the camera devices. A sensor system is positioned relative to the package and configured to capture distance data. The distance data may include a set of data points representing distance values between package regions having the formed wirebond connections and the sensor system. Data captured by monitoring equipment 110 is output to WASS 120.

Monitoring equipment 110 may be coupled to WASS 120 to pass data and control signals through communication links. Wired or wireless communication links may be used. These links may also include communication links that can send data or control signals over one or more data networks, such as, a local area network, medium area network, or large area network (e.g., Internet).

WASS 120 includes a controller 122, data manager 124, RF performance predictor tool 126, and alert generator 128. Controller 122 controls initiation and operation between components of system 120 (namely, data manager 124, RF performance predictor tool 126, and alert generator 128). Controller 122 may also control authorization of administrators or other users and sending communication messages (data and control) with authorized users. Data manager 124 manages storage and retrieval of captured input data received from monitoring equipment 110.

In operation, RF performance predictor tool 126 processes the captured input data with ML engine 130 using trained ML model 132 to obtain an output array of data. RF performance predictor tool 126 evaluates the output array of data to determine a predicted RF performance rating. RF performance predictor tool 126 may then output the predicted RF performance rating for storage, transmission or display. Having obtained a RF performance rating, RF performance predictor tool 126 may reject or pass the manufacture of package 105 according to the output predicted RF performance rating.

Alert generator 128 generates an alert based on the predicted RF performance rating output by RF performance predictor tool 126. In one feature, alert generator 128 generates an alert based on the predicted RF performance rating during wirebond assembly of the semiconductor package manufacture. In this way, poor performance is predicted during wirebond assembly in advance of testing and costly re-work and testing is avoided.

In one embodiment, WASS 120 including its components (controller 122, data manager 124, RF performance predictor tool 126, and alert generator 128) may be implemented in software, firmware or hardware or any combination thereof on one or more computing devices at the same or different locations. A computing device as used herein can be any type of computing device including, but not limited to, a smartphone, laptop, desktop, tablet, workstation, kiosk, embedded device, or other computing device having at least one processor and a computable readable memory. For example, an embedded device may have an embedded processor and memory in which the processor is configured to execute software or firmware stored in the memory. In further embodiments, WASS 120 including any or all of its components may be implemented using one or more application programming interfaces (APIs) as needed to access different services to perform operations on one or more remote servers as described herein.

ML engine 130 may be implemented in software, firmware or hardware or any combination thereof on one or more computing devices at the same or different locations. ML engine 130 may also be implemented using one or more application programming interfaces (APIs). For example, RF performance predictor tool 126 may pass a request to an API of a remote cloud computing service that implements ML engine 130 as described herein.

Trained ML model 132 and training dataset 135 may be stored in computer-readable memory at the same or different locations. WASS 120 is coupled to the computer-readable memory to access and retrieve data in the trained ML model 132 and training dataset 135.

The operation of system 100 is described in further detail below with respect to methods of semiconductor package manufacture using predictive RF performance shown in FIGS. 3-7. For brevity, the methods are described with reference to example monitoring equipment 110 and wirebond connections on a package 105 shown in FIGS. 2A-2B. Routines describing the use of training dataset 135 to train ML engine 130 to obtain trained ML model 132 are described in further detail with respect to FIGS. 5-6.

Package Surface Monitoring and Parameters

Figure 2A:
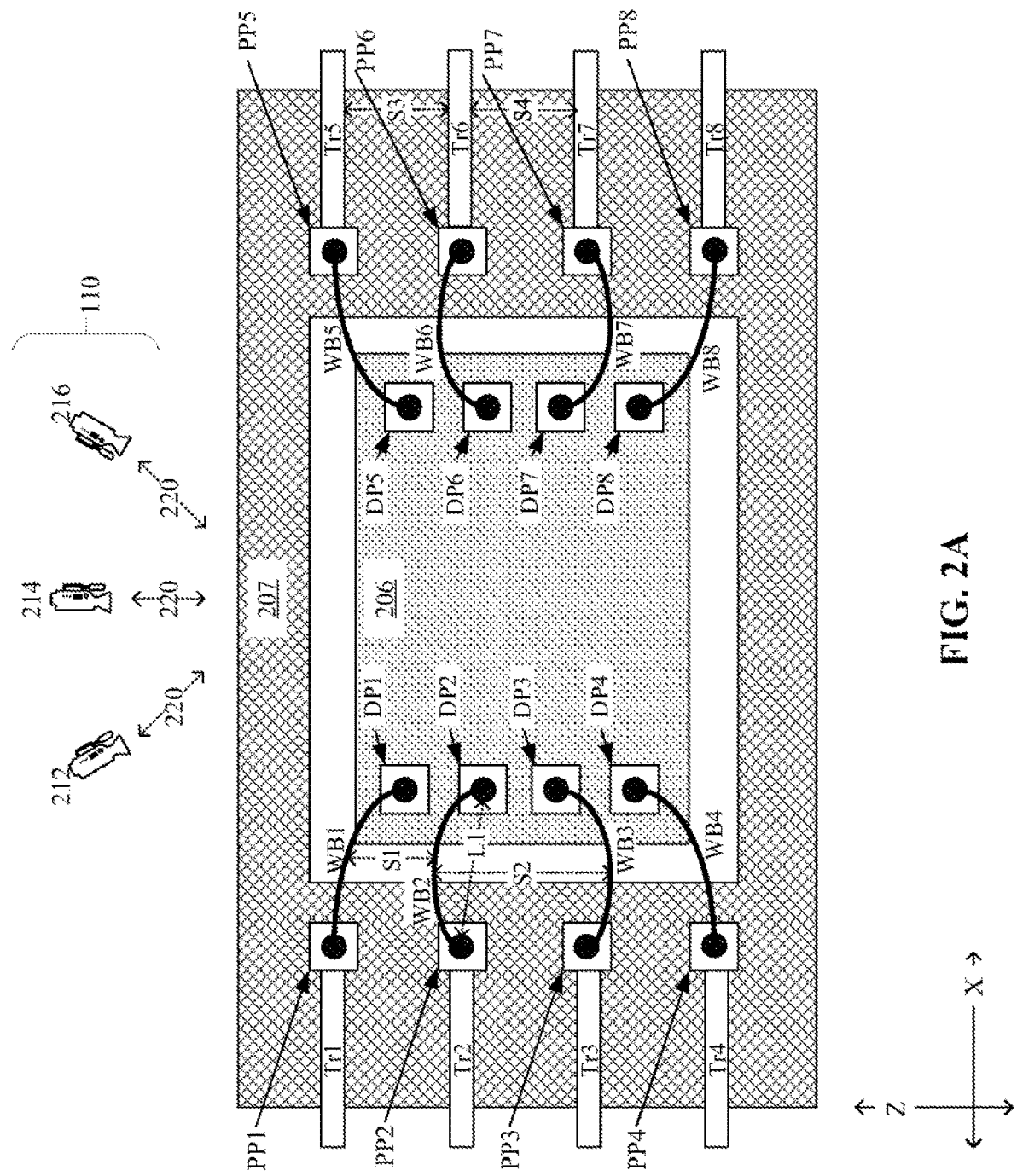
FIGS. 2A and 2B are diagrams showing two views of a package and monitoring equipment for wirebond interconnections and parameters according to an embodiment.
Figure 2B:
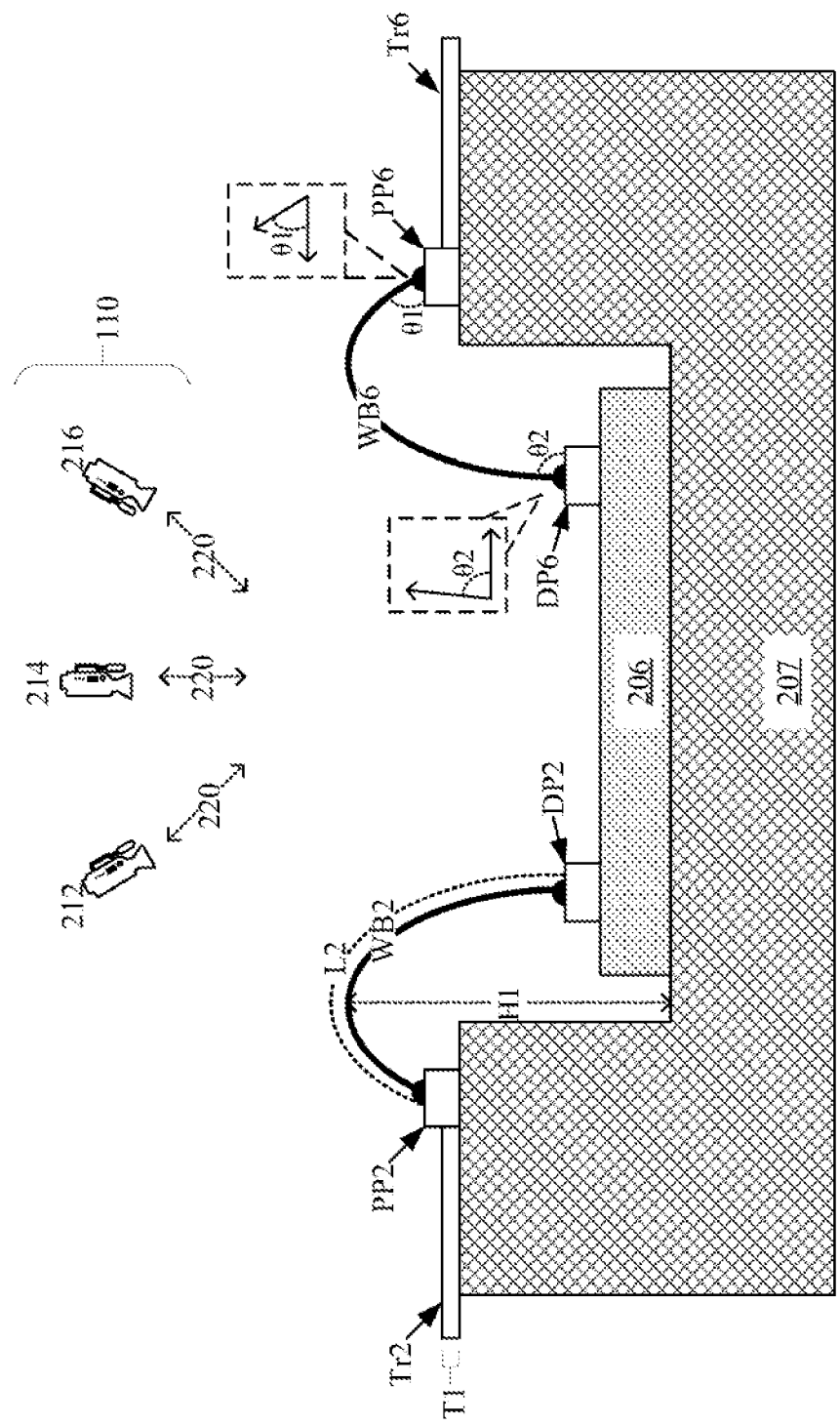

FIGS. 2A and 2B are diagrams showing two views of package 105 and monitoring equipment 110 for wirebond interconnections and parameters according to an embodiment. FIG. 2A shows a top view of package 105 as viewed by monitoring equipment 110. Package 105 has a MIMIC die 206 mounted on die substrate 207. FIG. 2B shows a cross-sectional view of FIG. 2A.

Eight wirebond interconnections (WB1-WB8) are formed between die 206 and substrate 207. Eight traces (Tr1-Tr8) lead out from the wirebond interconnections WB1-WB8. Die pads (DP1-DP8) may be used to support connection of one end of each wirebond interconnection (WB1-WB8) to die 206. Packaging pads (PP1-PP8) may be used to support connection of the other end of each wirebond interconnection (WB1-WB8) to substrate 207. Traces (Tr1-Tr8) are coupled to respective packaging pads (PP1-PP8). Each trace (Tr1-Tr8) has a respective length and width. Eight wirebond interconnections (WB1-WB8), die pads (DP1-DP8), and traces (Tr1-Tr8) are shown for illustrative purposes however this is not intended to be limiting. A fewer or larger number of wirebond interconnections, die pads, or traces may be used and in different configurations. For example, wirebond interconnections (e.g., WB1-WB8) may be positioned on different sides of a die, substrate, printed circuit board or package surface. Wirebond interconnections (e.g., WB1-WB8) may each be spaced or angled at the same or a different spacing or angle relative to one another or another surface.

As shown in FIG. 2A, monitoring equipment 110 may include an infrared camera device 212, optical camera device 214, and/or a light detection and ranging (LIDAR) sensor system 216. Infrared camera device 212 and optical camera device 214 capture infra-red and optical digital images, respectively, and are positioned relative to package 105 such that package regions on a top surface are within fields of view of the monitoring equipment 110. These package regions on top surface can include LIDAR sensor system 216 is positioned relative to the package 105 to capture distance data. The distance data may include a set of data points representing distance values from the LIDAR sensor system 216 to points on different regions of the top surface of package 105. The package regions on the top surface of package 105 monitored by infrared camera device 212, optical camera device 214, and a LIDAR sensor system 216 can include any surface on package 105 and its constituent elements formed during wirebond assembly. These surfaces include surfaces on MIMIC 206, wirebond interconnections (WB1-WB8), substrate 207, die pads (DP1-DP8), packaging pads (PP1-PP8), and traces (TR1-TR8).

Camera devices 212, 214 can be positioned directly above at 90 degrees normal to a surface of package 105 or at an angle relative to normal. Camera devices 212, 214 may be fixed at the same or different angles. Camera devices 212, 214 or stage 107 may also be moved relative to one another to scan a surface of package 105.

As shown in FIG. 2A and FIG. 2B, a number of parameters 220 may be obtained from monitoring. Wirebond interconnections (e.g., WB1-WB8) may be formed on sides of a die 206 as shown. Neighboring wirebond interconnections (e.g., WB1-WB8) may be separated by a spacing. Spacing between neighboring wirebond interconnections (e.g., WB1-WB8) may be the same or different from another depending a particular layout and the shape and length of wirebonds. For example, a first spacing S1 between a first wirebond interconnection WB1 and a second wirebond interconnection WB2 is exemplified in FIG. 2A. Additionally, a second spacing S2 between the second wirebond interconnection WB2 and a third wirebond interconnection WB3 is exemplified in FIG. 2A. Neighboring traces (e.g., Tr1-Tr8) may also be separated by a spacing. Spacing between neighboring traces (e.g., Tr1-Tr8) may be the same or different from another depending a particular layout. For example, a third spacing S3 between a fifth trace Tr5 and a sixth trace Tr6 is exemplified in FIG. 2A. Additionally, a fourth spacing S4 between the sixth trace Tr6 and a seventh trace Tr7 is exemplified in FIG. 2A.

Each wirebond interconnection (e.g., WB1-WB8) may have associated one or more parameters 220, including, for example, but not limited to: a wirebond planar length (e.g., represented by L1 in FIG. 2A), curvilinear length (e.g., represented by L2 in FIG. 2B), or loop height (e.g., exemplified by H1 in FIG. 2B). The wirebond planar length L1 is the length of the wirebond along a plane between ends of the wirebond. The curvilinear length L2 is the length of the wirebond itself from one end to the other end. The loop height H1 is the height of a wirebond measured from the top of a wirebond to a top surface of substrate 207 or die 206. Wirebond angles (e.g., exemplified by $\theta 1$ and $\theta 2$ in FIG. 2B) may be also be parameters 220 that are monitored. These parameters 220 are examples and not intended to be limiting.

Other parameters 220 and combinations of parameters 220 may be used as would be apparent to a person skilled the art given this description.

FIGS. 2A and 2B show in further detail example parameters 220 that may be monitored and captured for a pair of wirebond interconnections (WB2, WB6) on sides of package 105. FIG. 2A shows a wirebond planar length of WB2 extending between two ends of WB2. The first spacing S1 between WB2 and a nearest neighbor 1 (WB1) and the second spacing S2 between WB2 and a nearest neighbor 2 (WB3) are shown. A respective trace Tr2 having a length and width is also shown. Substrate 207 also can have spacing (e.g., third spacing S3) between Tr6 and a nearest neighbor 1 (Tr5) and a spacing (e.g., fourth spacing S4) between Tr5 and a nearest neighbor 2 (Tr7).

FIG. 2B shows two example wirebond angles θ1 and θ2 of a wirebond (WB6). Wirebond angle θ1 is the angle of WB6 at one end on a packaging pad (e.g., PP6) near a trace (Tr6). The loop height H1 from the top of wirebond WB2 to a top surface of substrate 207 is shown. Wirebond angle θ2 is the angle of WB6 at the other end on a die pad (e.g., DP6) on die 206. A thickness (e.g., represented by T1 in FIG. 2B) for trace Tr2 is also shown. While the example parameters 220 are shown in detail with respect to WB2, WB6 these are illustrative and not intended to limiting. Similar parameters 220 may be monitored for each of WB1-WB8.

Figure 2C:
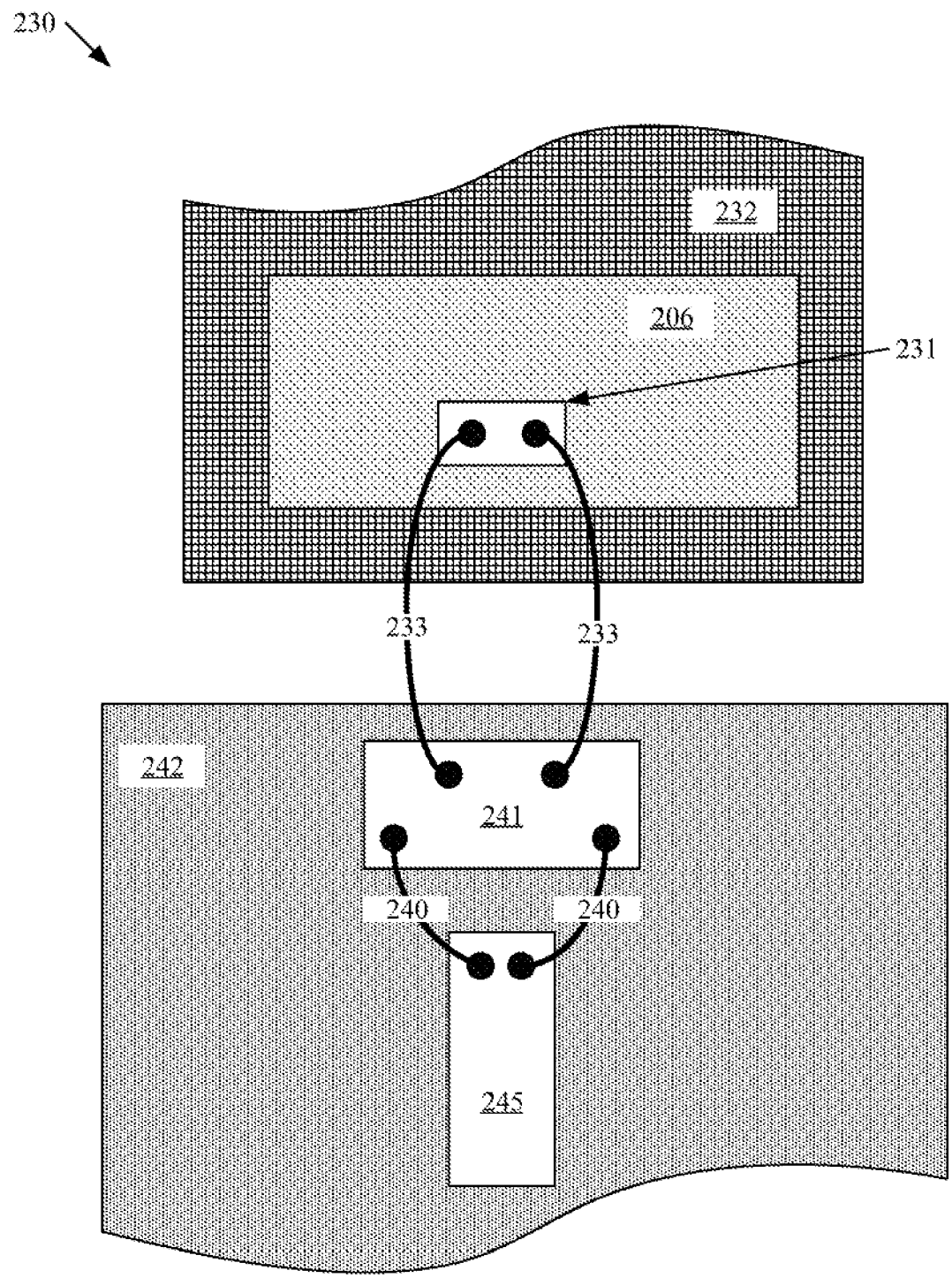
FIG. 2C is a diagram showing a wirebond assembly structure having wirebond interconnections forming an input to or an output from a die according to an embodiment.

The example of FIGS. 2A and 2B is illustrative and other packages and wirebond configurations can be monitored with RF predictive performance as described herein. For example, FIG. 2C is a diagram showing a wirebond assembly structure 230 having one or more first example wirebond interconnections 233 that form an input to (or an output from) a MIMIC die 206 on die pedestal 232 according to an embodiment. The one or more first example wirebond interconnections 233 each have one end coupled to example die pad 231 (which may be an input or an output in examples). The other end of the one or more first example wirebond interconnections 233 is coupled to a PCB pad 241 on a printed circuit board (PCB) 242. Additionally, one or more second example wirebond interconnections 240 may also be coupled to a PCB trace 245 or to other elements on PCB 242.

Figure 2D:
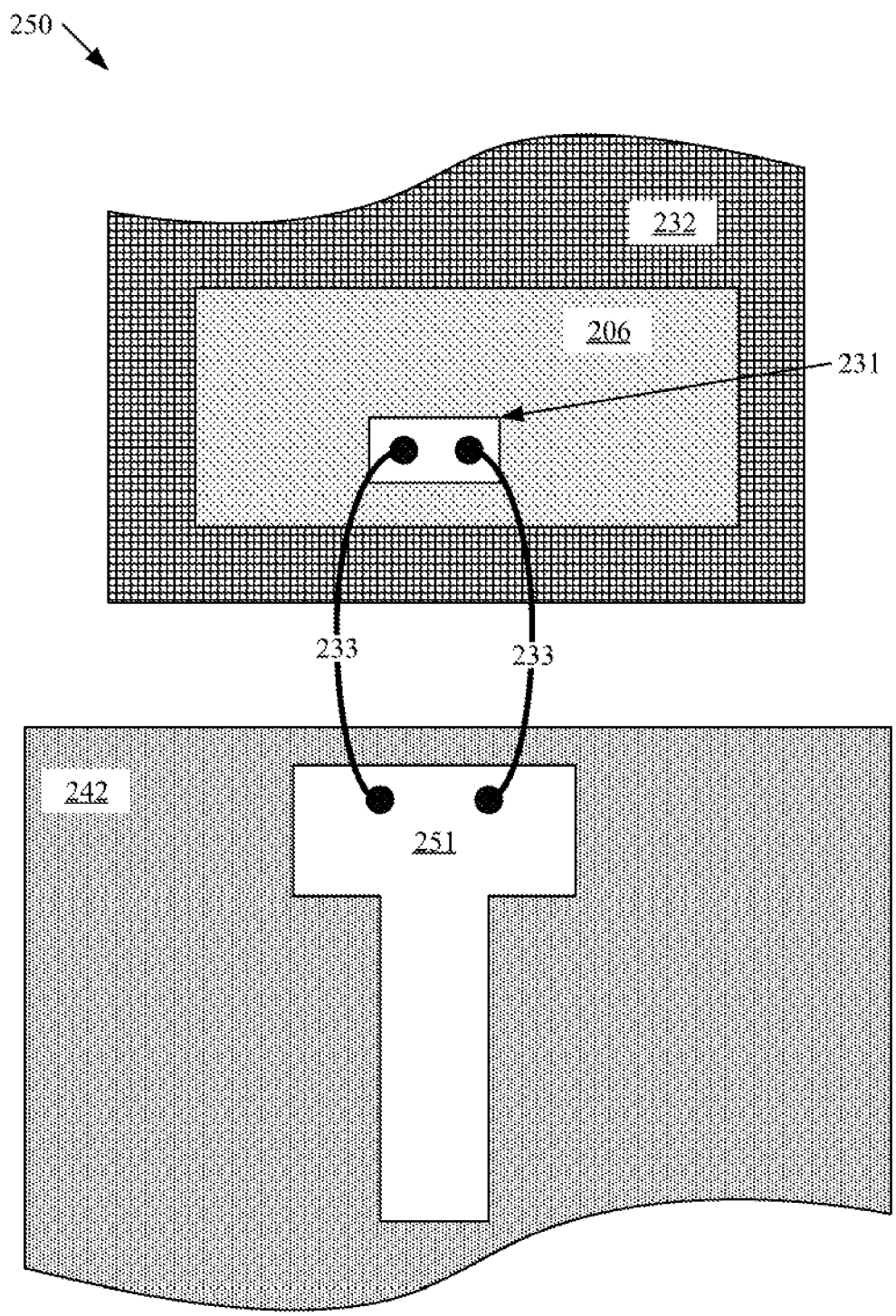
FIG. 2D is a diagram showing a wirebond assembly structure having wirebond interconnections forming an input to or an output from a die according to another embodiment.

FIG. 2D is a diagram showing a wirebond assembly structure 250 having the one or more first example wirebond interconnections 233 that form an output from (or an input to) a MIMIC die 206 on die pedestal 232 according to an embodiment. The one or more first example wirebond interconnections 233 each have one end coupled to die pad 231 (which may be an input or an output in examples). The other end of the one or more first example wirebond interconnections 233 is coupled to a PCB pad and trace 251 on PCB 242.

Operation with Predictive RF Performance

Figure 3:
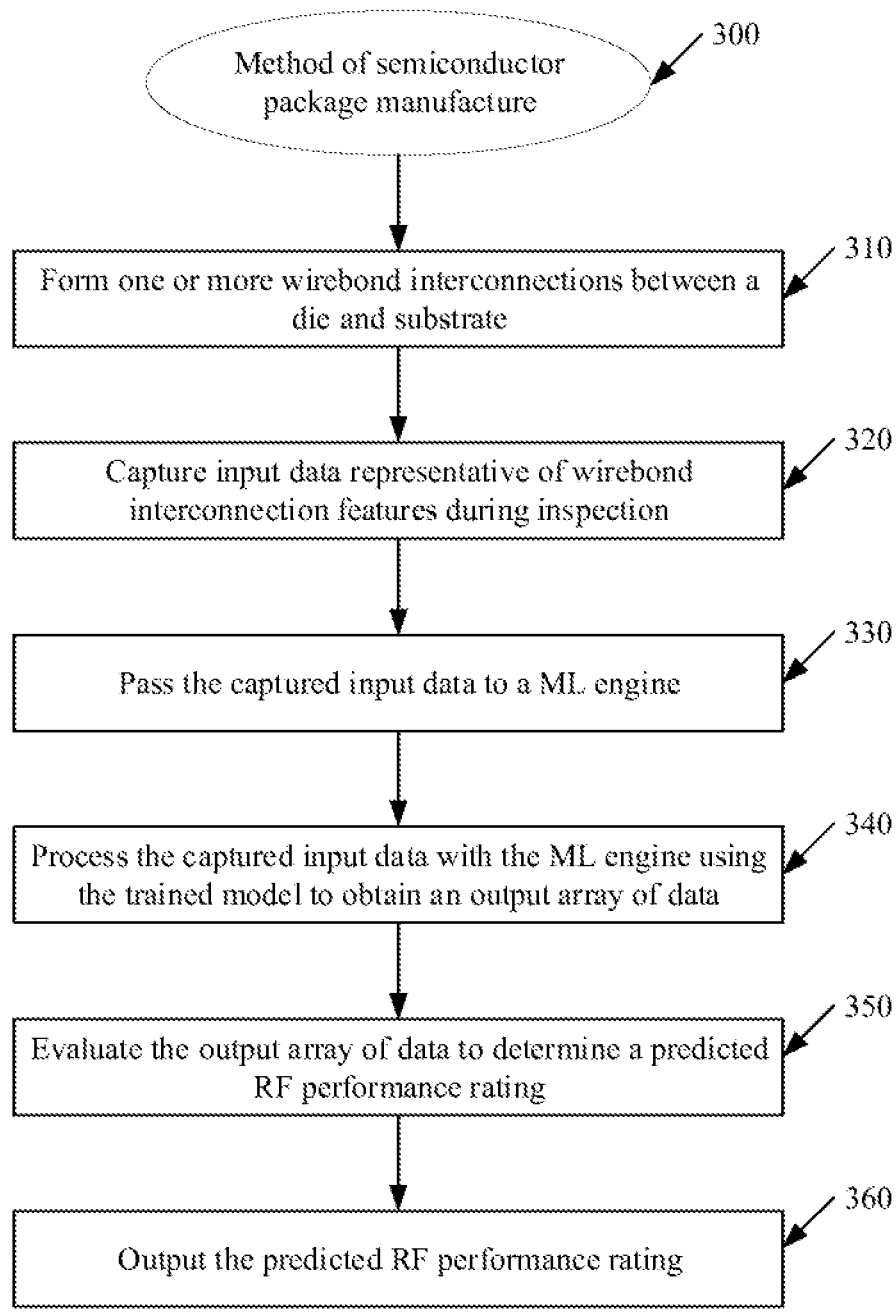
FIG. 3 is a flowchart diagram of a method of semiconductor package inspection with predictive RF performance for wirebond interconnections according to an embodiment.

FIG. 3 is a flowchart diagram of a method of semiconductor package manufacturing 300 with predictive RF performance for wirebond interconnections according to an embodiment (steps 310-360). For brevity, method 300 is described with reference to the example wirebond interconnections (e.g., WB1-WB8) of FIGS. 2A and 2B. However, this is not intended to be limiting as semiconductor package manufacturing method 300 with predictive RF performance can be used for other wirebond interconnections including, but not limited to, the wirebond assembly structures 230, 250 shown in FIGS. 2C and 2D.

In step 310, during wirebond assembly, one or more wirebond interconnections are formed between a die and a die substrate. In the example of FIG. 2A, multiple wirebond interconnections (e.g., WB1-WB8) are formed. While eight wirebond interconnections (WB1-WB8) are shown in FIG. 2A, the architecture of the wirebond assembly is not so limited. For example, embodiments in which fewer than eight wirebond interconnections, or more than eight wirebond interconnections, are formed are also envisaged. Any wirebond formation technique may be used. For example, ball bonding or wedge bonding techniques may be used to formed wirebonds. Heat, pressure, and/or sonic energy may be used as in thermosonic, thermocompression and ultrasonic bonding techniques.

In step 320, input data representative of wirebond interconnection features is captured during inspection of the formed wirebond interconnections. For example, stage 107 may position package 105 relative to monitoring equipment 110 for inspection. Monitoring equipment 110 then captures the input data representative of wirebond interconnection features during inspection of the formed wirebond interconnections. For example, monitoring equipment 110 may capture image data and sensor data and output the data to WAAS 120. Data manager 124 can receive the input data and store in a record in database 140 along with inspection event information (such as, a package identifier associated with the package 105 and a timestamp).

In step 330, captured input data is then sent to ML engine 130. In an embodiment, RF performance predictor tool 126 retrieves the input data from database 140 and output the retrieved input data to ML engine 130. For example, RF performance predictor tool 126 sends an API request to ML engine 130 requesting classification of the input data according to trained ML model 132. The API request may be one or more messages that pass the input data (e.g. image data and sensor data) and identify the trained ML model 132 to be used to classify the input data.

In step 340, ML engine 130 processes the captured input data using the trained model 132 to obtain an output array of data. ML engine 130 outputs the array of data to RF performance predictor tool 126. For example, the output array may be sent to fulfill the initiating API request sent by RF performance predictor tool 126. The processing of step 340 is described further below with respect to FIG. 7.

In step 350, the output array of data is evaluated to determine a predicted radio-frequency (RF) performance rating. For example, RF performance predictor tool 126 may evaluate one or more values in the output array of data to determine a RF performance rating. The RF performance rating is a prediction of RF performance of package 105 having wirebond interconnections. In one example, the RF performance rating identifies a RF performance level from among multiple performance levels. These different performance levels may be correspond to Pass/Fail levels, Pass/Warning/Fail levels, High/Medium/Low or other range of performance levels. The RF performance rating may be a numeric value (e.g. 0-100), a label (Pass/Fail), or other identifier associated with predicted RF performance.

In step 360, RF performance predictor tool 126 outputs the predicted RF performance rating. For example, the rating may be output for storage or display or for transmission to an administrator.

Figure 4:
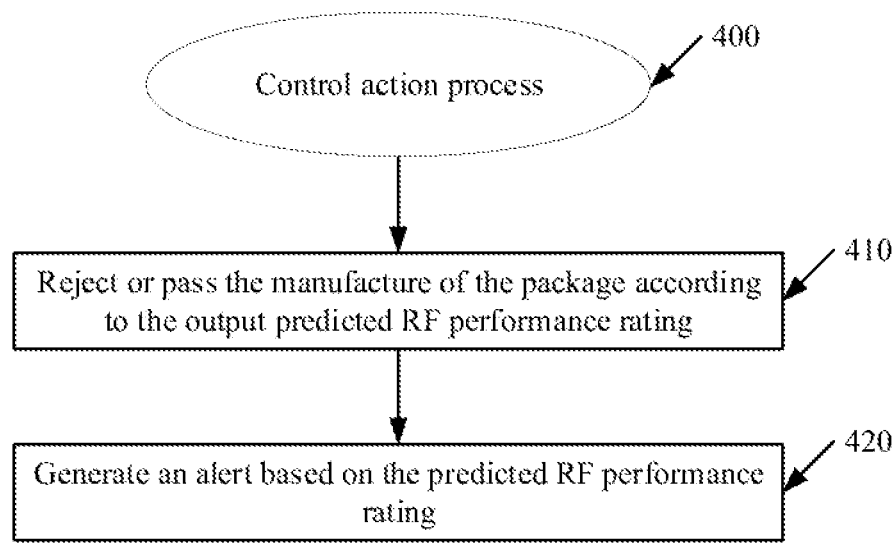
FIG. 4 is a flowchart diagram of a control action process according to an embodiment.

As shown in FIG. 4, further control actions may be taken in response to a predicted RF performance rating. FIG. 4 is a flowchart diagram of a control action process 400 according to an embodiment (steps 410-420). In step 410, RF performance predictor tool 126 rejects or passes the manufacture of package 105 according to the output predicted RF performance rating. Depending on the performance levels used, RF performance predictor tool 126 may also direct package 105 for further testing or rework for a warning rating.

In step 420, one or more alerts may be generated based on the predicted RF performance rating. Alert generator 128 generates an alert based on the predicted RF performance rating. An alert for example may be a visual, audible, or tactile or other message that can flag an alert condition to an administrator or other authorized user.

Machine learning including training and inference is described in further detail below. Training carried out in a training stage of ML engine 130 is described with respect to routine 500 shown in FIGS. 5-6. Inference carried out in an inference stage of ML engine 130 is described in further detail with respect to a routine in FIG. 7. An embodiment of ML engine 130 having training and inference stages is described with respect to FIGS. 8-9. For brevity, these routines 500 and step 340 are described with respect to ML engine 130 but are not necessarily limited thereto.

Machine Learning

Figure 8:
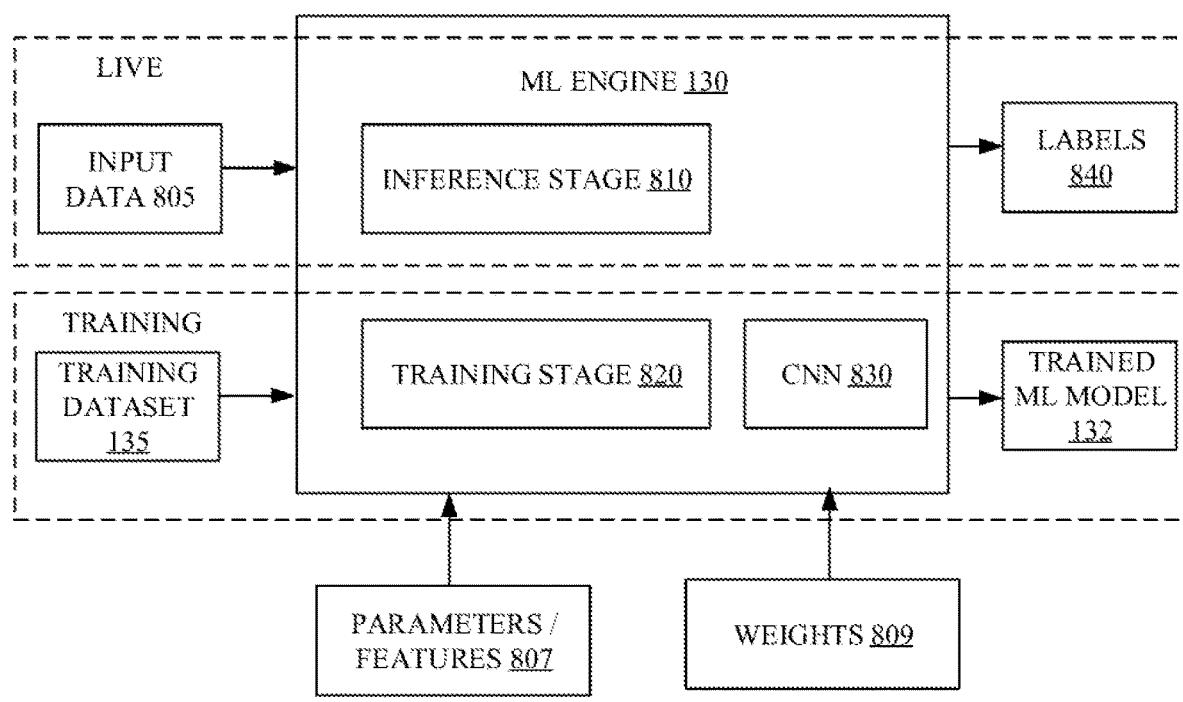
FIG. 8 is a block diagram of a ML engine according to an embodiment.
Figure 9:
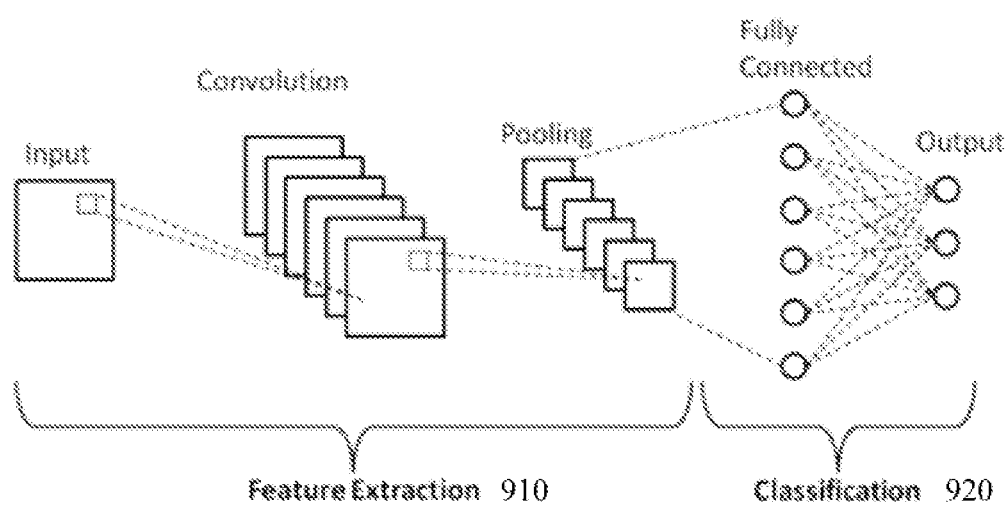
FIG. 9 is a diagram of a convolutional neural network (CNN) according to an embodiment.

FIG. 8 is a block diagram of ML engine 130 according to an embodiment. ML engine 130 includes an inference stage 810 and training stage 820. Training stage 820 further includes a multi-layer neural network (NN) 830. As shown in FIG. 9, in some embodiments, NN 830 can be a convolution neural network (CNN) having feature extraction layers 910 and classification layers 920. Feature extraction layers 910 may include an input layer, convolution layer and pooling layer. The input layer sets a size of input image data and can re-size if needed. Input image data is convolved by the convolution layer with multiple learning kernels using shared weights 809. The pooling layer reduces image size while trying to keep needed information for objection detection and feature extraction and to produce feature maps. Feature maps are then output to classification layers 920. Classification layers 920 combine extracted features in fully-connected layers having multiple nodes. An output layer has an output neuron for each object category. The output layer is coupled to receive and classify output from classification layers to obtain a classification result (label 840) and a probability that the result is correct. See, e.g., the description of feature extraction and classification of image data described by Van Hiep Phung and Eun Joo Rhee, "A High-Accuracy Model Average Ensemble of Convolutional Neural Networks for Classification of Cloud Image Patches on Small Datasets," *J. of Appl. Sci.* 2019, 9, 4500, 16 pages.

Training

During training, training stage 820 applies a training dataset 135 to NN 830 to obtain the trained ML model 132. Training in training stage 820 may be supervised learning, unsupervised learning or reinforcement learning. Training stage 820 processes the data in training dataset 135 with NN 830 including applying parameters or features 807 and weights 809 to obtain a set of candidate models. Training stage 820 further selects a trained ML model 132 from the set of candidate models. For example, a trained ML model 132 may be selected which minimizes a loss function or meets other design criteria. Hyperparameters may also be tuned to further help select a trained ML model 132.

In embodiments, training in training stage 820 involves changing weights associated with nodes in layers over many iterations until an expected output is obtained for particular training input data. One or more learning algorithms may be used to train layers of NN 830. For example, a gradient descent algorithm and backpropagation algorithm may be used in tandem when NN 830 is a deep multi-layer neural network. Supervised or unsupervised learning can be used to change weights to minimize a loss function. Reinforcement learning can be used to change weights to maximize a reward function. In further examples, activation functions, such as a sigmoid function, may also be used especially after layers with weights. Data fitting or regularization techniques to achieve a balanced CNN and avoid undesired overfitting or underfitting may also be used. Further optimizations may be employed to improve training, such as, expanding a training dataset with augmentation, increasing training time or the depth (or width) of a model, adding regularization, or increasing hyperparameter tuning as would be apparent to person skilled in the art given this description.

Figure 5:
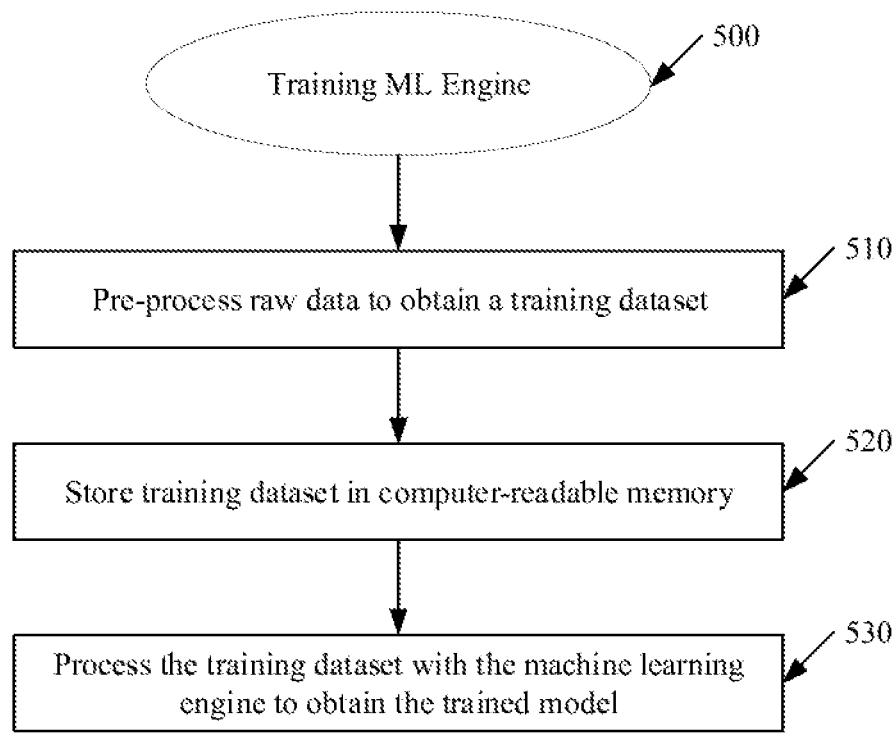
FIG. 5 is a flowchart diagram of a training process to train a ML engine according to an embodiment.
Figure 6:
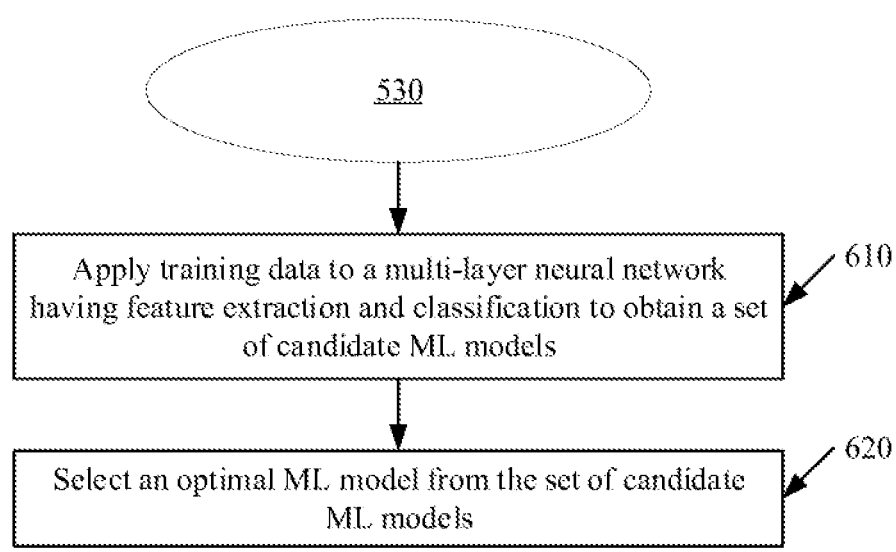
FIG. 6 is a flowchart diagram showing the training dataset processing step of FIG. 5 in further detail according to an embodiment.

FIG. 5 is a flowchart diagram of a training process 500 to train ML engine 130 according to an embodiment (steps 510-530). First, in step 530, training stage 820 pre-processes raw input data from test images or other predetermined images, sensor data or other synthetic data to obtain training dataset 135. For example, test images may be cropped or oriented to a common size and direction. Test images with excessive blurring or highlights may be removed. Images and sensor data obtained by monitoring equipment 110 on sample packages with known performance ratings may be used. Alternatively, training stage 820 may simply receive a training dataset 135 and omit the need for pre-processing.

In step 520, training stage 820 stores training dataset 135 in computer-readable memory coupled to ML engine 130. For example, training dataset 135 may be stored in memory at the same or different location as ML engine 130. Memory storing training dataset 135 may be local to ML engine 130 on the same computing device or stored on remote network location accessible over a network. This can include storage of the training dataset 135 on a cloud-based drive or storage service accessible by ML engine 130.

In step 530, training stage 820 processes training dataset 135 to obtain trained ML model 132. As shown in further detail in FIG. 6, step 530 first includes applying image data and parameters to multi-layer neural network having feature extraction and classification to obtain a set of candidate ML models (step 610). For example, training stage 820 applies image data from training dataset 135 and parameters or features 807 to multi-layer neural network 830 having feature extraction and classification to obtain a set of candidate ML models. In step 620, an optimal ML model is then selected from the set of candidate ML models for use as the trained model 132. For example, training stage 820 can select an optimal ML model from the set of candidate ML models which minimizes a loss function in supervised or unsupervised learning. Training stage 820 can also select an optimal ML model from the set of candidate ML models which maximizes a reward function in reinforcement learning depending upon a particular application.

One or more parameters 807 (also called features) relating to wirebond assembly or RF performance are used by training stage 820. Parameters 807 may be used by training stage 820 in obtaining the set of candidate models, assessing loss or reward functions, and selecting a trained model. Parameters 807 while shown separate in FIG. 8 for clarity may be included as part of training dataset 135. Labels 840 may also be included in training dataset 135 to facilitate training to obtain an optimal trained ML model 132. Training stage 820 can also employ hyperparameters to further tune a trained model 132.

In embodiments, parameters 807 may be a default set of desired parameters or may be set manually by an administrator or operator of ML Engine 130. Parameters 807 may also include more parameters identified automatically during training. Hyperparameters may be a default set or may be set manually by an administrator or operator of ML Engine 130.

Other training techniques can be used to obtain a trained ML model as would be apparent to one skilled in the art given this description. For example, augmentations of image data or other data used in a training data set may be done.

In addition to image data, training dataset 135 can also include sensor data (such as distance data points obtained in LIDAR or range data). Training stage 820 can then train using the sensor data from training dataset 135 along with the image data. The sensor data is applied to train NN 830 as described herein with respect to the image data.

Training dataset 135 can also include test instrument data collected during design, simulation, and manufacturing of the product or of similar products. The test instrument data may include product performance and RF performance characteristics, such as voltages, currents, scattering parameters, impedance, and spectral data.

Training dataset 135 can also include synthetic data relating to RF performance, such as, data obtained from EM modeling software. Examples of EM modeling software tools that can provide RF performance parameters are a SONNET SUITES tool available from Sonnet Software, Inc. and ANSYS HFSS design tool available from Ansys, Inc.

Training stage 820 can also train using the synthetic data in training dataset 135. The synthetic data is applied to further train NN 830 as described herein with respect to the image data and sensor data.

The above description of ML engine 130 with respect to CNN 830 is illustrative and not intend to be limiting. In further embodiments, ML engine 130 may use other multi-layer deep learning neural networks and architectures.

Example Wirebond and RF Performance Predictive Parameters and Labels

As mentioned above, training dataset 135 may include a number of parameters and labels to facilitate training. Such parameters may include wirebond parameters and RF performance parameters. Labels may include RF rating labels generated from testing prior packages with wirebond assemblies associated with known image data or sensor data, or known parameters or features.

In an embodiment, wirebond parameters include one or more of the following parameters for each wirebond: Wire Bond Planar Length (e.g., L1), Wire Bond curvilinear (3D) length (e.g., L2), Wire Bond Loop Height (e.g., H1), Wire Bond Diameter, or Angle of a wirebond from a bird's eye view relative to a plane.

In another embodiment, packages have traces coupled to wirebonds in matching sections, and the wirebond parameters include one or more of the following parameters: Wire Bond Planar Length (e.g., L1), Wire Bond curvilinear (3D) length (e.g., L2), Wire Bond Loop Height (e.g., H1), Wire Bond Diameter, Number of Wire Bonds, Rough spacing between neighboring wire bonds, Angle of wirebond from a bird's eye view relative to a plane, Trace widths of matching section, or Trace length of matching section.

MMIC Manufacturing Line

In embodiments, as wire bond interconnections and other structures and physical features (also referred to herein as "elements") are created during manufacturing of a MIMIC on a die, system 100 determines an RF rating of each such element and/or a combination of the elements. A pass rating may include multiple performance levels (e.g., high, medium, low; or selecting one of multiple RF performance ranges). Fail may include directions for redoing element(s).

Training

Training dataset 135 in these examples for a MMIC manufacturing line may include raw training data drawn from one or more sources. Raw training data used may be parameter values relating to the size and positioning of elements on an MMIC, RF performance of each element of combination of elements, and an RF rating label for each vector or other output of machine learning in ML engine 130. Sources for training data include: one or more test MMICs, one or more optical, IR, and/or Lidar devices that capture parameter values of each element or combination of elements, and a tester that measures RF performance of each element or combination of elements on the test MIMICS. A user or other administrator may provide an RF label that corresponds to the RF performance data. Further sources of training data may be used including historical data (e.g., records of MMICs manufactured in the past) or synthetic values of parameters produced by EM modeling software. Any combination of the above types and sources of training data may be used.

Also in training, model 132 can be designed to focus on one or more structures individually (e.g., the RF response of each wire bond on an MIMIC die). Alternatively, model 132 can be designed to determine the RF response of a series of structures comprising a conductive path (e.g., the RF response of the conductive path comprising the combination of trace 2 (Tr2), packaging pad 2 (PP2), wire bond 2 (WB2), and die pad 2 (DP2)).

Live Operation

In live operation, inference stage 810 receives input data 805 and can access trained ML model 132. Inference stage 810 processes input data 805 with trained ML model 132 to obtain an output array of data having a predicted value for an RF performance rating corresponding to package 105 with formed wirebond interconnections. The output array of data can include label 840 associated with the predicted value for an RF performance rating.

Figure 7:
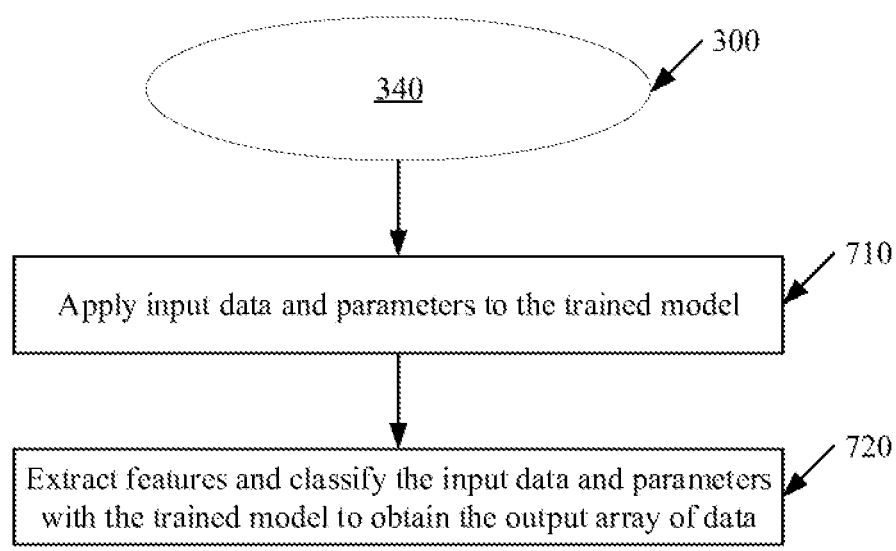
FIG. 7 is a flowchart diagram showing the input data processing step of FIG. 3 with the trained model in further detail according to an embodiment.

FIG. 7 is a flowchart diagram showing input data processing step 340 with trained model 132 in further detail according to an embodiment (steps 710-720). Steps 710-720 may be carried out by inference engine 810.

In step 710, inference stage 810 applies input data 805 and parameters 807 to trained ML model 132. In step 720, trained ML model 132 extracts features and classifies the input data and parameters to obtain an output array of data having a predicted value for an RF performance rating corresponding to the package with the formed wirebond interconnections.

For example, input data 805 may be live image data of package 105 captured by monitoring equipment 110 as described above. Parameters 807 may be live sensor data captured by monitoring equipment 110. Parameters 807 may also be default parameters or known parameters associated with the live input data used by inference stage 810 to classify input data 805.

Inference stage 810 may further generate label 840 associated with the predicted value for an RF performance rating corresponding to the package with the formed wirebond interconnections. For example, when the RF performance rating identifies a RF performance level from among multiple performance levels (such as PASS/FAIL, PASS/WARNING/FAIL, or HIGH/MEDIUM/LOW), label 840 can identify the particular performance level predicted.

Directions may be output as well. For example, a Fail rating or label 840 indicating Fail may also be provided with directions for redoing package 105 element(s) such as any of wirebond interconnections (WB1-WB8).

In one technical advantage, models trained using the above mentioned parameters when used to perform inference lead to a greater likelihood that manufactured parts will meet their performance criteria, resulting in higher manufacturing yields. For example, trained model 135 can be deployed on an MIMIC manufacturing line. As wire bonds and/or other elements are formed on an MIMIC, inference stage 810 of ML engine 130 receives input data 805 and rates predictive RF performance of individual elements or a combination of the elements. For example, vectors of data may be drawn from input data 805 for classification by model 132 to obtain labels 840 indicating the predicted RF performance. In this way, WASS 120 can identify structures on MMIC dies (or assemblies comprising one or more MIMIC dies) likely to have a deficient RF response.

Further Predictive RF Performance Applications and Structures

In further examples, wirebonds are conductive pieces of metal that connect two points, consisting of material (conductivity, often gold), thickness (mils), 3D curvilinear length (mils), planar length (mils; bird's eye view), number of wires (counts), spacing and angle of wires (relative shape of group). Pads (such as, Input Output Pads) are conductive metals pads often gold plated that form the input or output of a custom integrated circuit. For RF circuits, pads can have GSG (ground signal ground) or GSSG (ground signal signal ground) configurations, where there are single or multiple wires per pad.

Conductive traces may be transmission lines on top of printed wiring assemblies that are composed of the electrical properties of the dielectric (height, loss tangent, dielectric constant, isotropic or anisotropic), trace height, plating, trace length, and trace width. These electrical properties may be used as one more parameters in parameters 807. The position of conductive traces on a printed wire assembly (PWA) can help infer the parameters values relative to the specified nominal values (given manufacturing tolerances).

In one simulation carried out by inventors, a simulation of RF performance was performed with a simulation design tool, ANSYS HFSS, available from Ansys, Inc. ANSYS HFSS model which gave optimum results with a set of parameters. This set of parameters from the simulation can be used as synthetic data in training dataset 135 as described above.

Further Embodiments and Example Implementations

Various embodiments (including WASS 120 and its components 122-128) can be implemented on one or more computing devices. The computing devices may be at the same or different locations. A computing device can be any type of device having one or more processors and memory. For example, a computing device can be a workstation, mobile device (e.g., a mobile phone, personal digital assistant, tablet or laptop), computer, server, computer cluster, server farm, game console, set-top box, kiosk, embedded device or system, or other device having at least one processor and computer-readable memory. In addition to at least one processor and memory, such a computing device may include software, firmware, hardware, or a combination thereof. Software may include one or more applications and an operating system. Hardware can include, but is not limited to, a processor, memory and user interface display or other input/output device.

Aspects of computing embodiments may also include client and server sides (including remote users on remote computing devices coupled to WASS 120) may be implemented electronically using hardware, software modules, firmware, tangible computer readable or computer usable storage media having instructions stored thereon, or a combination thereof and may be implemented in one or more computer systems or other processing systems.

Embodiments are also directed to computer program products comprising software stored on any computer-usable medium. Such software, when executed in one or more data processing devices (such as a processor), causes a data processing device(s) to operate as described herein or, as noted above, allows for the synthesis and/or manufacture of electronic devices (e.g., ASICs, or processors) to perform embodiments described herein. Embodiments employ any computer-usable or -readable medium, and any computer-usable or -readable storage medium known now or in the future. Examples of computer-usable or computer-readable mediums include, but are not limited to, primary storage devices (e.g., any type of random access memory), secondary storage devices (e.g., hard drives, floppy disks, CD ROMS, ZIP disks, tapes, magnetic storage devices, optical storage devices, MEMS, nano-technological storage devices, etc.), and communication mediums (e.g., wired and wireless communications networks, local area networks, wide area networks, intranets, etc.). Computer-usable or computer-readable mediums can include any form of transitory (which include signals) or non-transitory media (which exclude signals). Non-transitory media comprise, by way of non-limiting example, the aforementioned physical storage devices (e.g., primary and secondary storage devices).

Additional Embodiments

The present disclosure is also directed to the following exemplary embodiments:

Embodiment 1: An inspection system for use in semiconductor package manufacturing of a semiconductor package having a die, die substrate, and one or more wirebond interconnections formed between the die and the die substrate, comprising: monitoring equipment positioned relative to a stage supporting the semiconductor package and configured to capture input data representative of wirebond interconnection features during inspection of the formed wirebond interconnections; a wirebond assembly supervisor system that includes: a controller; a data manager configured to manage data including the captured input data, a training dataset, and a trained machine learning model; a RF performance predictor tool configured to: process the captured input data with a machine learning engine using the trained machine learning model to obtain an output array of data, evaluate the output array of data to determine a predicted radio-frequency (RF) performance rating, and output the predicted RF performance rating; and an alert generator configured to generate an alert based on the predicted RF performance rating.

Embodiment 2: The system of embodiment 1, wherein the semiconductor package includes a substrate having a monothilic microwave integrated circuit (MIMIC) coupled to the one or more wirebond connections.

Embodiment 3: The system of embodiment 1 or 2, wherein the semiconductor package further includes a die input pad or a die output pad coupled to the one or more wirebond connections.

Embodiment 4: A tool for predicting RF performance of wirebond interconnections formed between a die and die substrate in a package, comprising: computer-readable memory configured to store a trained model; and at least one processor configured to: process captured input data with a machine learning engine using the trained model to obtain an output array of data, evaluate the output array of data to determine a predicted radio-frequency (RF) performance rating of the formed wirebond interconnections, and output the predicted RF performance rating.

Embodiment 5: The tool of embodiment 4, wherein the machine learning engine includes a multi-layered neural network.

Embodiment 6: The tool of embodiment 5, wherein the multi-layer neural network includes a convolutional neural network (CNN).

Embodiment 7: A system for predicting RF performance of wirebond interconnections formed between a die and die substrate in a package, comprising: means for processing captured input data with a machine learning engine using a trained model to obtain an output array of data; means for evaluating the output array of data to determine a predicted radio-frequency (RF) performance rating; and means for outputting the predicted RF performance rating.

Embodiment 8: A device having a computer-readable storage medium with instructions stored thereon which are configured to cause at least one processor to perform the following operations for predicting radio-frequency (RF) performance of wirebond interconnections formed between a die and die substrate in a package, the operations comprising: receiving captured input data representative of wirebond interconnection features during inspection of the formed wirebond interconnections; processing captured input data with a machine learning engine using a trained model to obtain an output array of data; evaluating the output array of data to determine a predicted RF performance rating; and outputting the predicted RF performance rating.

Embodiments of the present invention have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed. The breadth and scope of the present invention should not be limited by any of the above-described exemplary embodiments.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

What is claimed is:

1. A method of inspection of a semiconductor package having a die and die substrate during semiconductor package manufacture, comprising:
   forming one or more wirebond interconnections between the die and the die substrate;
   capturing input data representative of one or more wirebond interconnection features during the inspection of the one or more formed wirebond interconnections, the input data comprising one or more digital images captured of the one or more formed wirebond interconnections;
   processing the captured input data using a machine learning (ML) model to obtain an output array of data having a predicted value indicative of a radio-frequency (RF) performance of the semiconductor package with the one or more formed wirebond interconnections, wherein the ML model is trained based on wirebond parameters and RF performance parameters;
   evaluating the output array of data to determine an RF (RF) performance rating for the semiconductor package;
   outputting the RF performance rating; and
   rejecting or passing a manufacture of the package according to the output RF performance rating.

2. The method of claim 1, further comprising:
   rejecting the manufacture of the package according to the output RF performance rating.

3. The method of claim 2, wherein the rejecting of the manufacture of the package according to the output RF performance rating occurs during or after wirebonding assembly of the semiconductor package manufacture.

4. The method of claim 1, further comprising:
   generating an alert based on the RF performance rating.

5. The method of claim 4, wherein the generating the alert occurs during wirebonding assembly in the semiconductor package manufacture.

6. The method of claim 1, wherein the capturing the input data comprises capturing the one or more digital images with optical or infrared camera devices positioned relative to the package such that package regions having the one or more formed wirebond connections are within fields of view of the optical or infrared camera devices.

7. The method of claim 6, wherein the capturing the input data comprises capturing distance data with a sensor system positioned relative to the package, the distance data including a set of data points representing distance values between the package regions having the one or more formed wirebond connections and the sensor system.

8. The method of claim 1, further comprising:
   storing a training dataset in computer-readable memory; and
   training an ML algorithm based on the training dataset to obtain the trained model.

9. The method of claim 8, wherein the ML algorithm is a multi-layer neural network algorithm, and the training the ML algorithm includes:
   applying image data and parameters to the multi-layer neural network algorithm having feature extraction and classification to obtain a set of candidate ML models; and
   selecting one of candidate ML model from the set of candidate ML models for use as the ML model.

10. The method of claim 9, wherein the training dataset includes the wirebond parameters, the RF performance parameters, and RF rating labels generated from prior wirebond assemblies.

11. The method of claim 10, wherein the wirebond parameters include the following parameters for each wirebond: wire bond planar length, wire bond curvilinear (3D) length, wire bond loop height, wire bond diameter, and angle of wirebond from a bird's eye view relative to a plane.

12. The method of claim 10, wherein traces are coupled to the wirebonds in matching sections and the wirebond parameters include one or more of the following parameters: wire bond planar length, wire bond curvilinear (3D) length, wire bond loop height, wire bond diameter, number of wire bonds, rough spacing between neighboring wire bonds, angle of wirebond from a bird's eye view relative to a plane, trace widths of matching section, or trace length of matching section.

13. The method of claim 10, wherein traces are coupled to the wirebonds in matching sections and the wirebond parameters include the following parameters: wire bond planar length, wire bond curvilinear (3D) length, wire bond loop height, wire bond diameter, number of wire bonds, rough spacing between neighboring wire bonds, angle of wirebond from a bird's eye view relative to a plane, trace widths of matching section, or trace length of matching section.

14. The method of claim 10, wherein the training dataset further includes synthetic data relating to RF performance obtained from modeling software.

15. The method of claim 10, wherein the ML model comprises a trained neural network model and the ML engine includes an inference stage, and the processing the captured input data includes classifying the input data in the inference stage with the trained neural network model to obtain the output array of data.

16. The method of claim 15, wherein the RF performance rating identifies an RF performance level from among multiple performance levels.

17. An inspection system for use in manufacturing a semiconductor package having a die, a die substrate, and one or more wirebond interconnections formed between the die and the die substrate, comprising:
  imaging sensors to capture input data representative of wirebond interconnection features during inspection of the one or more formed wirebond interconnections, the input data comprising one or more digital images of the one or more formed wirebond interconnections; and
  a radio-frequency (RF) performance predictor tool operating on a computing device configured to:
    process the captured input data with a machine learning (ML) engine having a ML model trained based on wirebond parameters and RF performance parameters to obtain an output array of data having a predicted value indicative of a radio-frequency (RF) performance of the semiconductor package with the one or or more formed wirebond interconnections;
    evaluate the output array of data to determine an RF performance rating for the semiconductor package,
    output the RF performance rating; and
    reject or pass a manufacture of the semiconductor package based on the output RF performance rating.

18. The system of claim 17, wherein the RF performance predictor tool is further configured to reject the manufacture of the semiconductor package based on the output RF performance rating.

19. The system of claim 17, further comprising an alert generator operating on the computing device configured to generate an alert based on the RF performance rating.

20. The system of claim 17, wherein the alert generator is configured to generate an alert based on the RF performance rating during wirebonding assembly of the semiconductor package manufacture.

21. The system of claim 17, wherein the imaging sensors include one or more optical or infrared camera devices to capture the one or more digital images and positioned relative to the semiconductor package such that package regions having the one or more formed wirebond connections are within fields of view of the optical or infrared camera devices.

22. The system of claim 21, wherein the imaging sensors are positioned relative to the semiconductor package and configured to capture distance data including a set of data points representing distance values between package regions having the one or more formed wirebond connections and the sensor system.

23. The system of claim 17, further comprising:
  a computer-readable memory configured to store a training dataset; and
  at least one processor configured to process the training dataset with the machine learning engine to train an ML algorithm to obtain the ML model.

24. The system of claim 23, wherein the ML algorithm is a multi-layer neural network algorithm and the at least one processor is configured to during the training to:
  apply image data and parameters to the multi-layer neural network algorithm having feature extraction and classification to obtain a set of candidate ML models, and
  select one of candidate ML model from the set of candidate ML models for use as the ML model.

25. The system of claim 23, wherein the training dataset includes the wirebond parameters, the RF performance parameters, and RF rating labels generated from prior wirebond assemblies.

26. The system of claim 25, wherein the wirebond parameters include the following parameters for each wirebond: wire bond planar length, wire bond curvilinear (3D) length, wire bond loop height, wire bond diameter, and angle of wirebond from a bird's eye view relative to a plane.

27. The system of claim 25, wherein traces are coupled to the wirebonds in matching sections and the wirebond parameters include one or more of the following parameters: wire bond planar length, wire bond curvilinear (3D) length, wire bond loop height, wire bond diameter, number of wire bonds, rough spacing between neighboring wire bonds, angle of wirebond from a bird's eye view relative to a plane, trace widths of matching section, or trace length of matching section.

28. The system of claim 25, wherein traces are coupled to the wirebonds in matching sections and the wirebond parameters include the following parameters: wire bond planar length, wire bond curvilinear (3D) length, wire bond loop height, wire bond diameter, number of wire bonds, rough spacing between neighboring wire bonds, angle of wirebond from a bird's eye view relative to a plane, trace widths of matching section, or trace length of matching section.

29. The system of claim 25, wherein the training dataset further includes synthetic data relating to RF performance obtained from modeling software.

30. The system of claim 25, wherein the ML model comprises a trained neural network model and the ML engine includes an inference stage, and the processing the captured input data includes classifying the input data in the inference stage with the trained neural network model to obtain the output array of data.

31. The system of claim 17, wherein the RF performance rating identifies an RF performance level from among multiple performance levels.

32. The system of claim 17, further comprising an ML engine coupled to the RF performance predictor.

33. The system of claim 32, wherein the ML engine includes an inference stage, a training stage, and a multi-layer neural network, the multi-layer neural network corresponding to the ML model.

34. The system of claim 33, wherein the multi-layer neural network includes a convolutional neural network (CNN).

* * * * *